United States Patent
Steutermann

(10) Patent No.: US 10,910,543 B2
(45) Date of Patent: Feb. 2, 2021

(54) THERMO-ELECTRIC DEVICE TO PROVIDE ELECTRICAL POWER

(71) Applicant: Karl Joseph Steutermann, Crestwood, KY (US)

(72) Inventor: Karl Joseph Steutermann, Crestwood, KY (US)

( * ) Notice: Subject to any disclaimer, the term of this patent is extended or adjusted under 35 U.S.C. 154(b) by 133 days.

(21) Appl. No.: 16/350,867

(22) Filed: Jan. 24, 2019

(65) Prior Publication Data
US 2019/0165236 A1 May 30, 2019

Related U.S. Application Data

(63) Continuation-in-part of application No. 14/999,538, filed on May 21, 2016, now abandoned.

(60) Provisional application No. 62/164,937, filed on May 21, 2015.

(51) Int. Cl.
| | | |
|---|---|---|
| H01L 35/32 | (2006.01) | |
| H01L 35/34 | (2006.01) | |
| H01L 35/20 | (2006.01) | |
| H01L 35/02 | (2006.01) | |
| H02J 7/00 | (2006.01) | |
| H01L 35/28 | (2006.01) | |
| H02J 7/34 | (2006.01) | |

(52) U.S. Cl.
CPC ............ *H01L 35/32* (2013.01); *H01L 35/02* (2013.01); *H01L 35/20* (2013.01); *H01L 35/28* (2013.01); *H02J 7/0013* (2013.01); *H01L 35/34* (2013.01); *H02J 7/345* (2013.01)

(58) Field of Classification Search
CPC ......... H01L 35/32; H01L 35/02; H01L 35/28; H01L 35/20; H02J 7/0013; H02J 7/345; H02J 50/001
See application file for complete search history.

(56) References Cited

U.S. PATENT DOCUMENTS

| | | | | |
|---|---|---|---|---|
| 3,767,470 A * | 10/1973 | Hines | ................ | G01K 7/02 |
| | | | | 136/225 |
| 7,473,029 B2 * | 1/2009 | Hutter | ................ | G01K 7/02 |
| | | | | 136/225 |
| 9,964,454 B2 * | 5/2018 | Danley | ............... | G01N 25/20 |
| 2005/0115601 A1 * | 6/2005 | Olsen | ............... | H01L 35/16 |
| | | | | 136/212 |
| 2009/0025774 A1 * | 1/2009 | Plissonnier | ........... | H01L 35/32 |
| | | | | 136/224 |
| 2009/0126771 A1 * | 5/2009 | Takahashi | ............ | H01L 35/32 |
| | | | | 136/203 |
| 2014/0338715 A1 * | 11/2014 | Grunlan | ............. | H01L 35/24 |
| | | | | 136/205 |
| 2015/0325768 A1 * | 11/2015 | Sakai | ............... | H01L 35/34 |
| | | | | 136/211 |
| 2015/0380628 A1 * | 12/2015 | Kanno | .............. | H01L 35/34 |
| | | | | 136/201 |
| 2016/0163949 A1 * | 6/2016 | Stark | ............... | H01L 35/32 |
| | | | | 136/212 |

* cited by examiner

*Primary Examiner* — Michael C Zarroli

(57) ABSTRACT

A thermoelectric device to generate electrical power at high voltages, for example 110 volts to 900 volts, using a thermopile, a temperature differential applied to the thermopile and the Seebeck Coefficient of dissimilar materials assembled in a defined manner and in conjunction with controls and batteries to power electric devices.

7 Claims, 17 Drawing Sheets

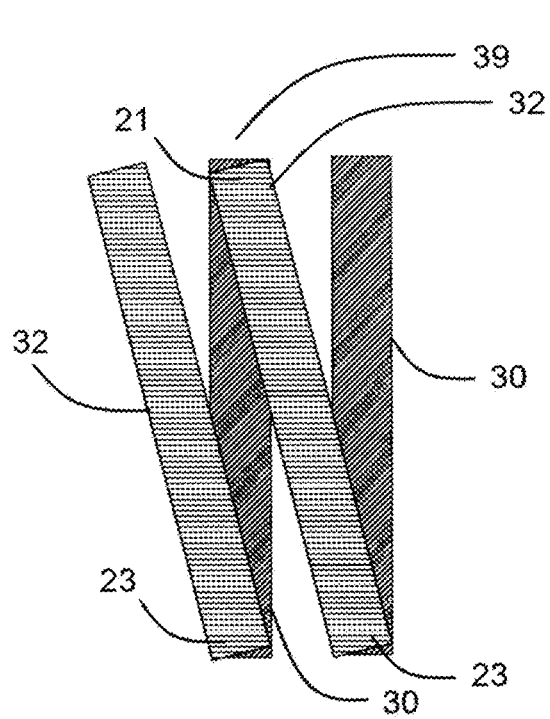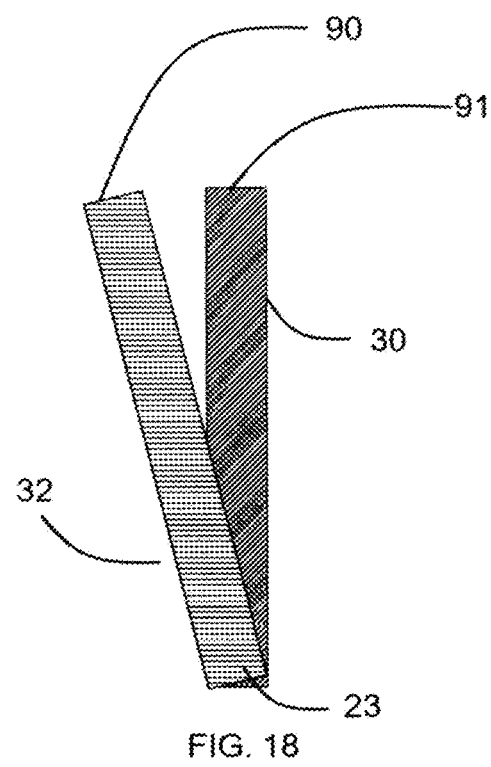
FIG. 19
FIG. 18

THERMO-ELECTRIC DEVICE TO PROVIDE ELECTRICAL POWER

CROSS REFERENCE TO RELATED APPLICATIONS

This application claims priority from U.S. Provisional Patent Application Ser. No. 62/164,937 filed on May 21, 2015, which is incorporated by reference herein in its entirety.

TECHNICAL FIELD

A thermoelectric device to generate electrical power at selected voltages, for example 110 volts to 900 volts using a thermopile.

BACKGROUND OF THE INVENTION

The present invention relates to the field of devices used to generate power for electrical powered devices by converting a temperature difference into electrical energy.

An electric car, for example, generally uses several expensive and heavy batteries with a limited capacity, that is, miles per charge. Recharge stations for these vehicles require specialized chargers for the different types of batteries. These stations are expensive and require maintenance.

Many industrial, commercial and residential entities such as hospitals, factories, banks, commercial retailers, and so on require back-up power in case of power loss due to storms, accidents or other power failure. Data loss in banking and commercial enterprises can cost thousands of dollars or more. Many such entities have dedicated back-up generators, generally gas or diesel powered generators, which are automatically activated in event of loss of commercial power to maintain commercial or emergency operation. Computer and data backup are often in the form of large banks of DC batteries. Uninterruptible Power Supplies provide backup power for other computer systems. Space and remote habitat facilities require electrical power in isolated environments. Other commercial operations have processes that generate heat, which is wasted into the atmosphere but could be captured and turned into electricity.

Creation and use of electrical power for sustained periods without direct use of fossil fuels and without permanent connection to the electrical grid is severely restricted. The invention solves this problem of generation of electrical power without the direct burning of fuels and without the use of radioactive material.

BRIEF DESCRIPTION OF THE DRAWINGS

A better understanding of the present invention will be had upon reference to the following description in conjunction with the accompanying drawings in which a unique means for constructing thermopiles within the scope of the present invention. Like numerals refer to like parts throughout the views wherein:

FIG. 18 is a diagram of a thermocouple of nichrome and constantan with nichrome strip in horizontal position and constantan strip in angled position;

FIG. 19 is a diagram of two thermocouples of material (1) such as Nichrome and material (2) such as constantan forming a thermopile of two thermocouples, material (2) 32 is at an angle 73 in relation to material (1) 30 as shown;

SUMMARY OF THE INVENTION

The present invention utilizes thermocouples and the Seebeck Coefficient of dissimilar materials assembled in a unique manner and in conjunction with controls, a capacitance means, and batteries to power electric devices. The thermocouples connected in series comprise a thermopile generating electrical power at high voltages, for example 110 volts to 900 volts, from a temperature differential applied to the thermopile The thermopile, FIG. 19, consisting of multiple thermocouples FIG. 18, for example 100,000 thermocouples, is located so a temperature gradient applied to it with use of a material at selected temperatures, for example paraffin heated to 270 degrees Celsius or liquid nitrogen at minus 200 degrees Celsius, and ambient air temperature such that the thermopile generates DC voltages at two output terminals.

Figure 13:
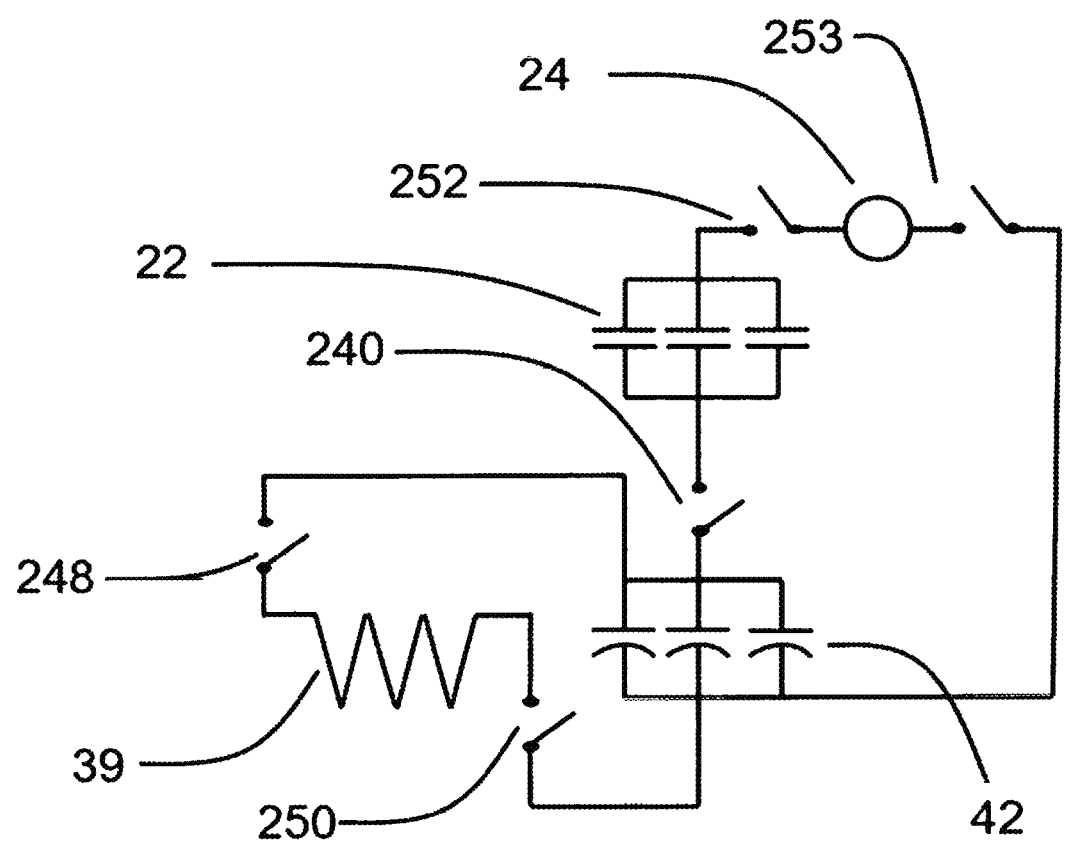
FIG. 13 shows control circuit in state (1), with all switches 240, 248, 250, 252, and 253 open, for the electrical power generation system showing the electrical circuit including the batteries 22, capacitors 42, thermopile 39 and switches connected to power an electric load 24.

A control circuit FIG. 13, including switching transistors capable of switching currents and voltage in a range of amps and voltages in a range of volts is used to connect the thermopile to a capacitance means, such as grouping of capacitors capable of operating in a selected range of volts DC is connected to a control circuit and to rechargeable batteries and finally to an electronic load.

Figure 17:
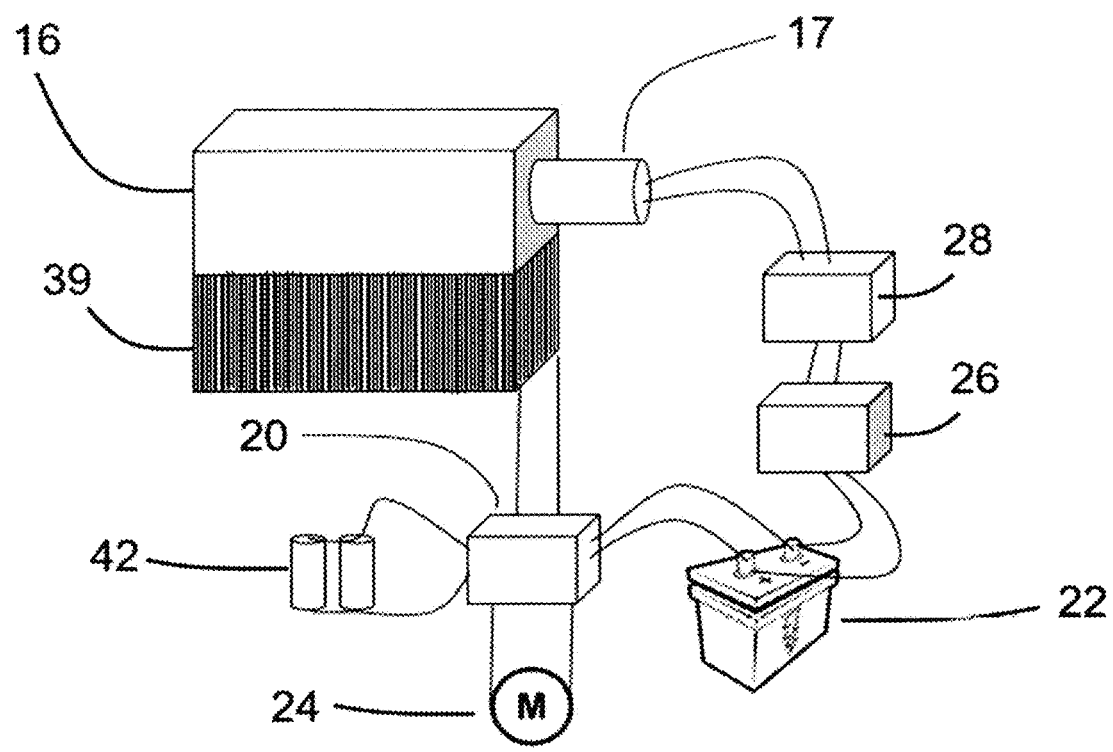
FIG. 17 is a diagram of the entire power generating system of the present invention.

A Device Recharging System, FIG. 17, selectively connected to an external power source to reheat material used to create a temperature difference on the thermopile and simultaneously recharge batteries.

DESCRIPTION OF THE PREFERRED EMBODIMENTS

The foregoing detailed description is given primarily for clearness of understanding and no unnecessary limitations are to be understood therefrom, for modification will become obvious to those skilled in the art upon reading this disclosure and may be made without departing from the spirit of the invention and scope of the appended claims. Accordingly, this invention is not intended to be limited by the specific examples presented herein. Rather, what is intended to be covered is within the spirit and scope of the appended claims.

Thermopile Construction

The present invention provides a thermoelectric device which can be designed to generate voltages, for example between 110V and 900V or more, using a thermopile consisting of a selected number of thermocouples in series, for example 100,000 thermocouples, exposed to temperature differentials and controls and batteries to power devices such as an electric load as described herein.

Based on the Seebeck effect, a small electrical potential is created across the length of a wire due to a difference in temperature along that wire. Thermocouples are created by connecting two sections of dissimilar metal at a junction with the opposite ends free, see FIG. 18. A temperature difference between the junction connection 23 and the free ends of the two sections creates an electrical voltage between each of those free ends of the sections, 90 and 91.

This effect is most easily observed and applied as shown in FIG. 18 with a junction 23 of two dissimilar metals in contact, such as Nichrome 30 and Constantan 32, where the junction 23 of the two metals is at one temperature and the free ends, 90 and 91, of the two materials is at a different temperature than the junction 23. This translates to a voltage between the two ends, 90 and 91. Most, if not all, pairs of dissimilar metals will produce a measurable voltage when their junction is heated or cooled relative to the temperature of the opposite free ends. Different combinations of selected metals produce differing voltages per degree of temperature difference.

The physical properties of materials include a Seebeck coefficient. For example, the Seebeck coefficient of Nichrome is +25 microvolts per degree Celsius. The Seebeck coefficient of Constantan is −35 microvolts per degree Celsius. If one end of a Nichrome wire is connected to one end of a constantan wire forming a junction 23 as shown in FIG. 18, the cumulative Seebeck coefficient of the thermocouple between the opposite ends 90 and 91 will be approximately: 25−(−35)=60 microvolts per degree Celsius. The Seebeck effect is typically linear in that the voltage produced by a heated junction of two wires is directly proportional to the temperature.

Figure 6:
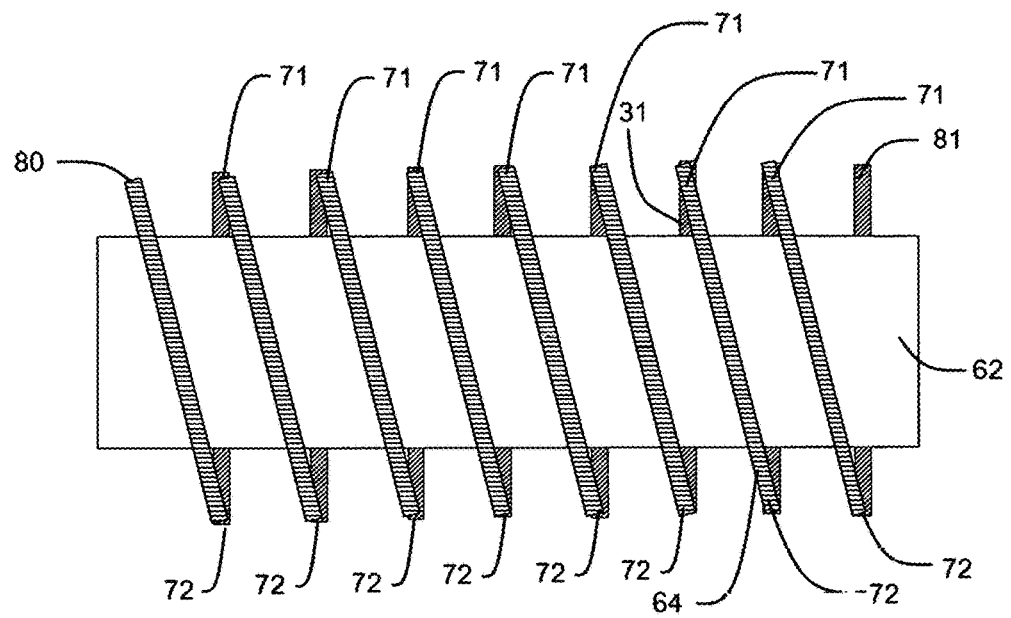
FIG. 6 shows the front view of the thermocard in FIG. 4 with the tabs 32a and 32b removed; thermocouple material (1) 31 and thermocouple material (2) 64 sections are fastened together at points 71 and 72 across the length of the thermocard and are separated in their middle by insulating material 62; when points/junctions at 71 are at one temperature and points/junctions at 72 are at a different temperature, a voltage is created between point 80 and 81.

Two thermocouples, FIG. 19, connected in series can produce twice the voltage of one single thermocouple, FIG. 18. Three thermocouples produce three times the voltage of one thermocouple and so forth. The voltage increases proportionately with the number of thermocouples connected in series. Multiple thermocouples connected in series form what is called a thermopile. By connecting many thermocouples in series, as shown in FIG. 6, and creating a temperature difference at one side of the junctions 71 and a different temperature at the other side of junctions 72, a thermopile can be constructed to produce substantial amounts of voltage between the free ends 80 and 81 of FIG. 6.

Figure 1:
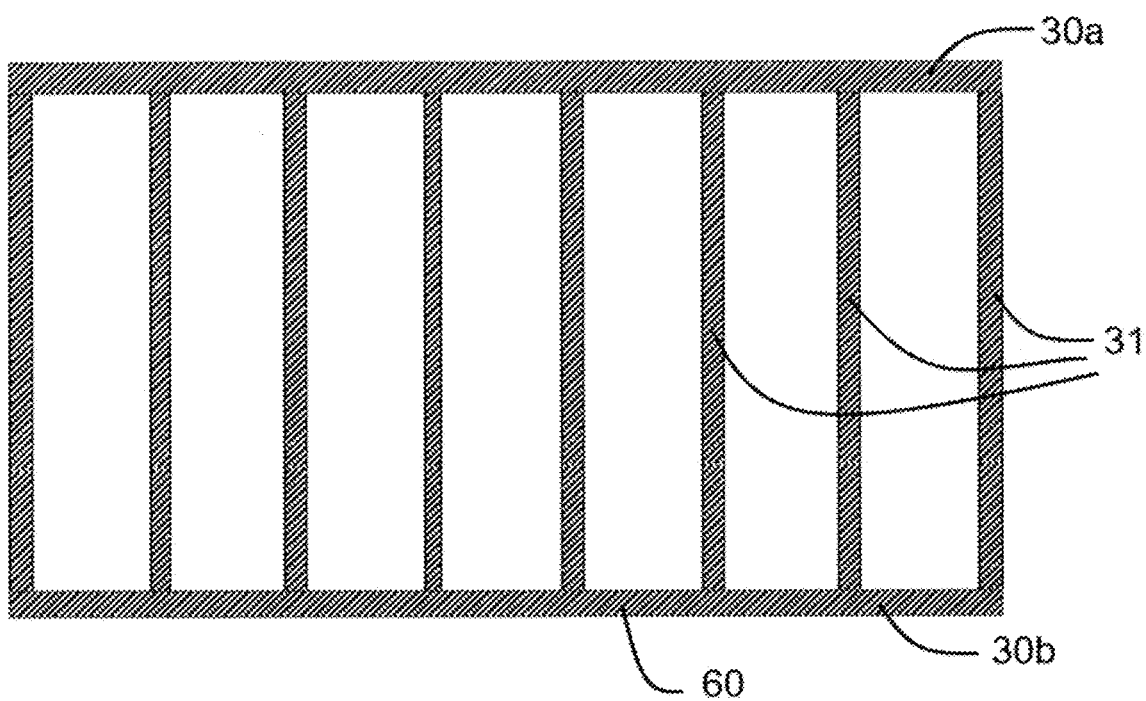
FIG. 1 is a front view of thermocouple material (1), such as nichrome sheet, with an arrangement of slots forming flat sections of thermocouple material (1) 31 with tabs at top 30a and bottom 30b.

For example, a thermopile can be constructed of two selected materials, for example Nichrome and Constantan, with Seebeck Coefficient properties such as to create a thermocouple. FIG. 1 shows an arrangement of a thermocouple material (1) 60, such as Nichrome sheet, of selected dimensions. Slots are created in the sheet wherein strips of material 31 remain between the slots of the sheet of material 60 leaving edges on the sheet 30a and 30b. The slot and material dimensions are variable. The edges 30a and 30b will be removed at final assembly.

Figure 3:
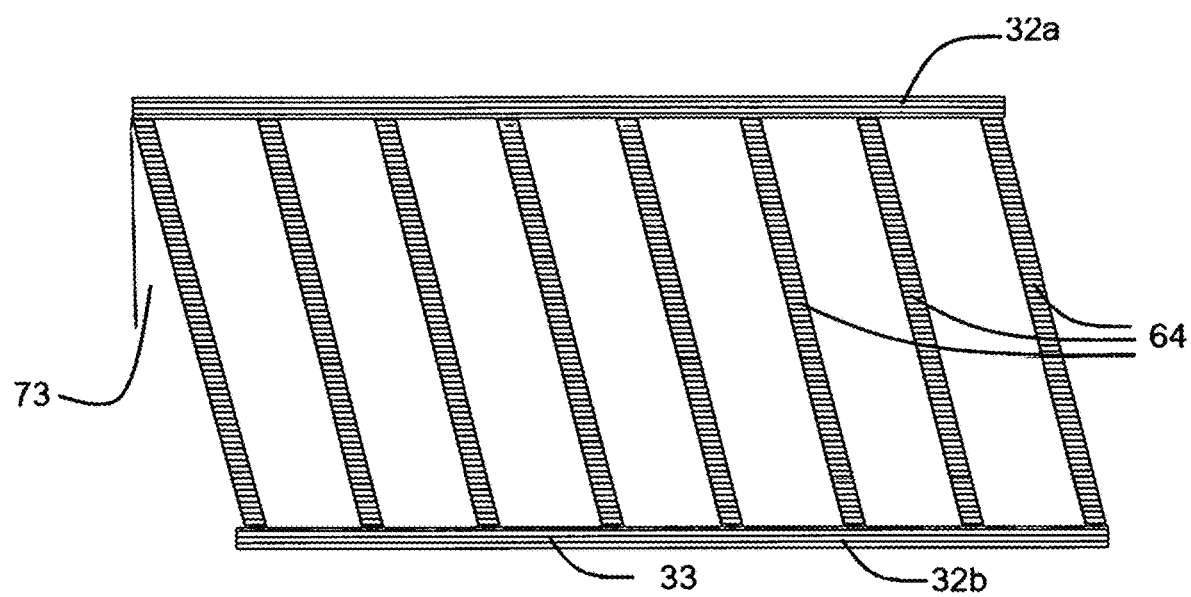
FIG. 3 is a front view of the thermocouple material (2), such as constantan sheet, with an arrangement of slots at an angle in relation to the slots of thermocouple material (1) of FIGS. 1 and 2, forming angled 73 flat sections 64 of thermocouple material (2) with tabs at top 32a and bottom 32b.

As shown in FIG. 3, the second thermocouple material (2) 33, such as constantan sheet, can be formed from selected dimensions similar or equal overall dimensions of thermocouple material (1). However, the slots in this sheet are created at an angle, 73, in relation to the slots of material (1). Again, edges are left on the sheet 32a and 32b. The angle of slots in material (2) in relation to material (1) is further shown in FIG. 19. The material and slot dimensions may vary.

Figure 2:
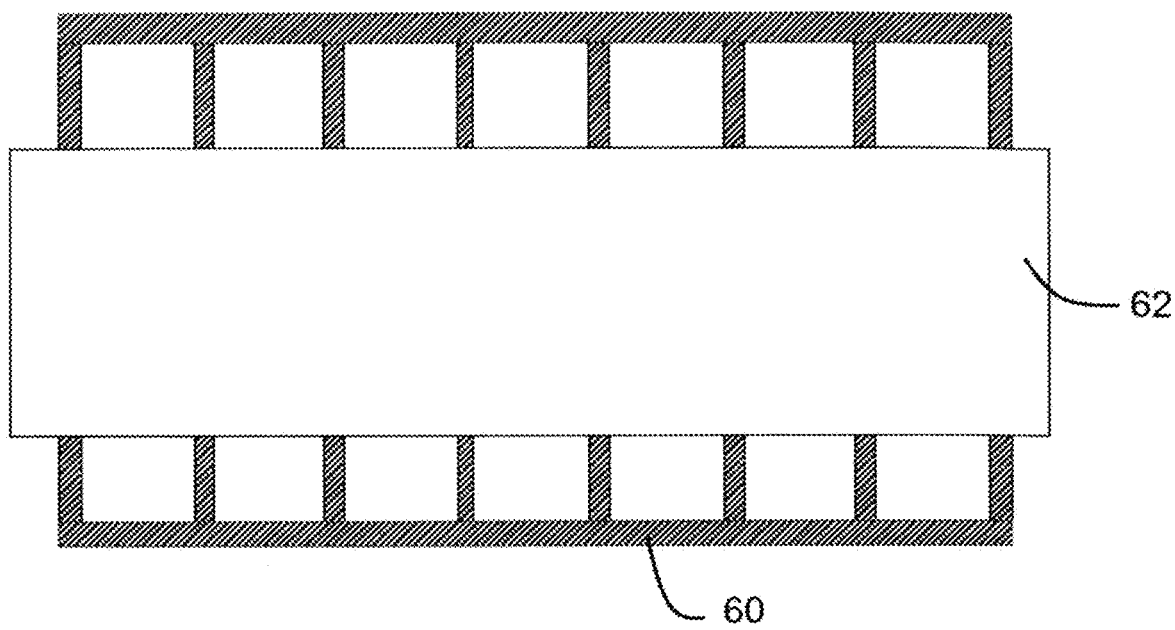
FIG. 2 is a front view of the thermocouple material (1) of FIG. 1 with an insulating means covering the mid-section of the slot pattern.
Figure 4:
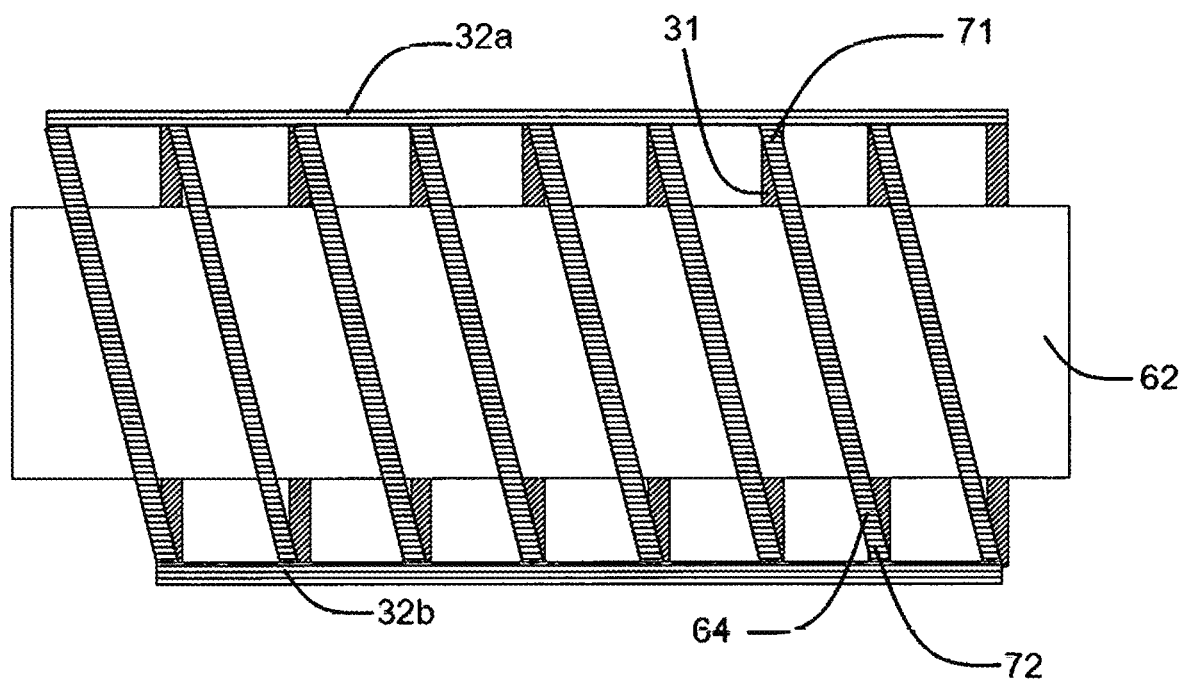
FIG. 4, is a front view of the thermocouple material (1) 60 from FIG. 2, and thermocouple material (2) 33 from FIG. 3, arranged with the insulating material in between the two materials 62; the top of the first thermocouple material 1 flat section meets the top of the first thermocouple material (2) flat section 71; the bottom of the first thermocouple material (2) section meets the bottom of the second section of thermocouple material (1) 72, repeating this pattern forms a zig-zag pattern of connected thermocouples across and is called a thermocard.
Figure 5:
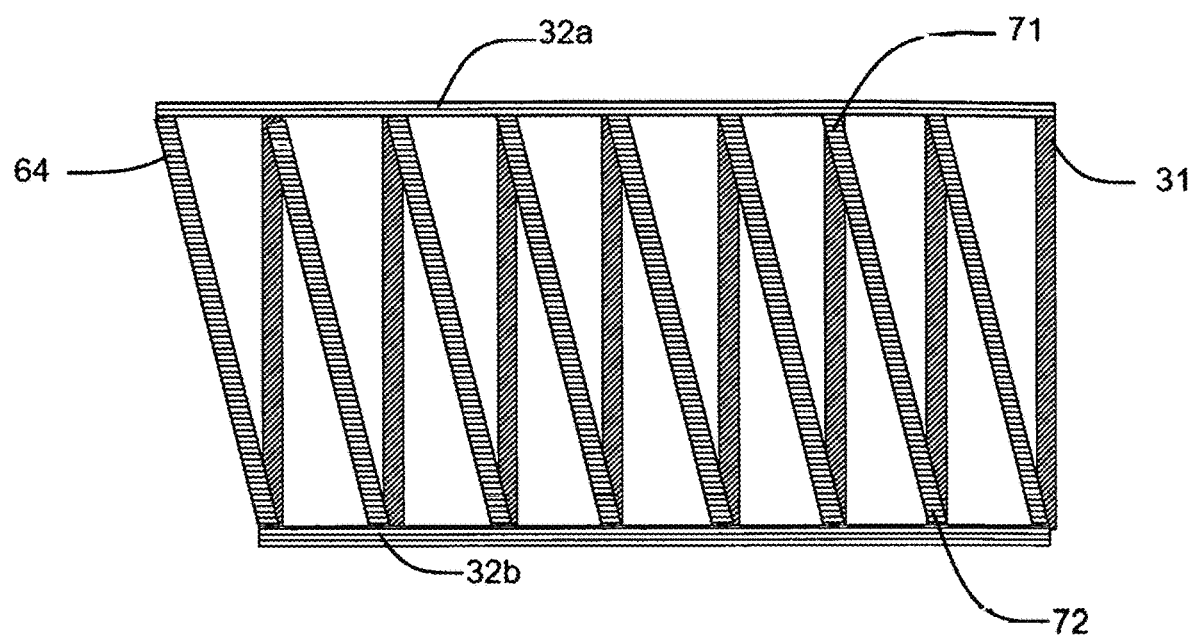
FIG. 5 shows the thermocard of FIG. 4 without the insulating material 62 for illustrative purposes only; the Figure shows the physical relation of thermocouple material (1) 31 to thermocouple material (2) 64; p

As shown in FIG. 2, an electrically insulating material such as electrically insulating paper 62 is placed on top of the thermocouple material (1) 60 of FIG. 1. The electrically insulating material allows for the tops and bottoms of the slots to be exposed as shown in the figure. The thermoelectric material (2) sheet is placed on top of the electrically insulating material, which is on top of the thermoelectric material (1) sheet. The assembly as shown in FIG. 4, then forms three layers, thermocouple material (1) as shown in FIG. 1 on the bottom, insulating material as shown in FIG. 2 in the middle, and thermocouple material (2) as shown in FIG. 3 on top. As shown in FIGS. 2 and 4, the insulating sheet 62 is narrower than the width of the conductive sheets 33 and 60. Therefore, as shown in FIG. 4, a selected portion of each electrically conductive sheet 33 and 60 containing electrically conductive sections 31 and 64 are in electrical conduction with one another on either side of the insulating sheet 62 at points 71 and 72. Furthermore, conductive sheets 33 and 60 are arranged on either side of the insulator sheet 62 so that the ends of the section of thermocouple material (1), 31, and the ends of the sections of the thermocouple material (2), 64, are in alignment and the two components overlap each other. The angle of the slots of thermoelectric material (2), as shown in FIG. 3 item 73 and further shown in FIG. 4, is such that the top of the first thermocouple material (1) section, 31, meets the top of one thermocouple material (2) section, 64, at point 71; the bottom of said thermocouple material (2) section, 64, meets the bottom of the adjacent section of thermocouple material (1) at point 72. Repeating this pattern forms a zig-zag pattern of sections of thermoelectric material (1) and thermoelectric material (2) creating a series of thermocouples. As stated and shown in FIG. 4, the ends of the sections of thermoelectric material (1) 31 and thermoelectric material (2) 64, over lap at points 71 and 72 and are in contact with each other, on both sides of the assembly. Every overlapping section end is fastened together in electrically conductive contact at points 71 and 72 to form a thermocouple at these points of overlap only. When all section ends similar to points 71 and 72 are fastened together in this manner, multiple thermocouples are formed and linked together across the assembly. Each point across the assembly where the overlapping sections are fastened, points 71 and 72, forms a thermocouple junction. The insulating material 62 ensures that the two thermoelectric materials are in contact at their end points, such as at 71 and 72 and similar points across the assembly. FIG. 5 is shown for further clarification only and illustrates the assembly of FIG. 4 without insulating material 62.

The tabs at the top and bottom of thermoelectric material (1) and thermoelectric material (2), as shown as items 30a and 30b in FIG. 1 and shown as items 32a and 32b in FIG. 3, are removed after each of the points of overlap are fastened together. The result is shown in FIG. 6. As shown in FIG. 6, multiple thermocouples are therefore created in a chain from left to right. The assembly in FIG. 6 is called a thermocard.

When the top junctions 71 of the thermocard in FIG. 6 are exposed to one temperature and the bottom junctions 72 are exposed to a different temperature, a voltage difference is created between points 80 and 81 in FIG. 6.

The dimensions of the sheets in FIGS. 1 through 6 can be altered to achieve different voltage and space requirements.

The electrically insulating material may be an electrical insulator such as MYLAR, polyethylene, styrene, electrically insulating paper or others.

The fastening of the section ends at points 71 and 72 of FIG. 4 and FIG. 6 maybe accomplished by epoxying with electrically conductive epoxy, welding such as electric resistance welding, soldering, brazing, crimping together or by other means physically connecting the two section at those points in electrical conduction. They may also be connected via another conductive material such as copper wire.

Figure 7:
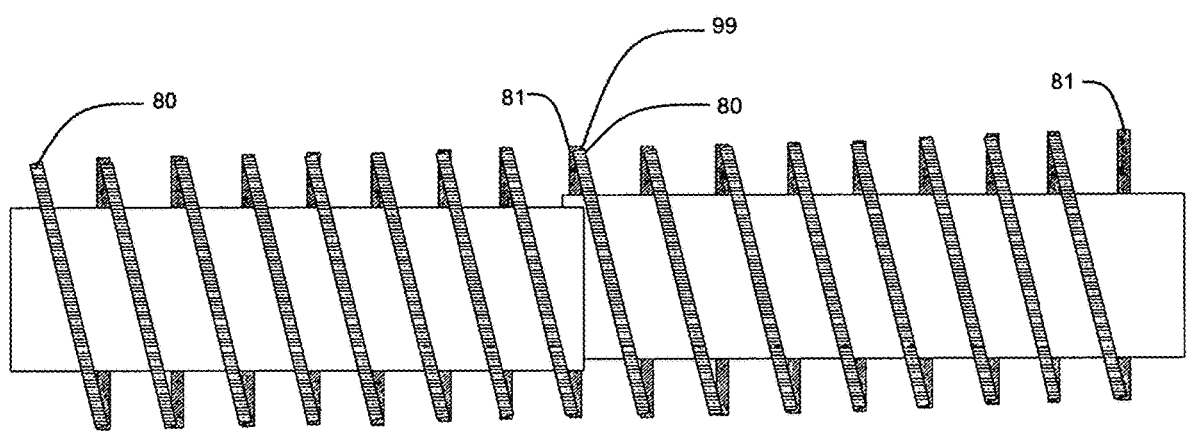
FIG. 7 is view of two thermocards from FIG. 6 connected in series at points 80 and 81 in the middle of the assembly; multiple thermocards may be connected in this manner to form a larger thermopile of desired size.

The thermocard, when fully assembled can comprise a selected number of thermocouples, for example 200 thermocouples in a series. As shown in FIG. 7, multiple thermocards can be connected in series. The last thermoelectric material (2) section of a selected thermocard, point 80, is electrically connected to the first thermoelectric material (1) section of the adjacent thermocard point 81, as shown in FIG. 7. The connections may be made by crimping the ends of conductive wires to each of the elements and/or welding and/or soldering/brazing the ends or physically connecting by other mean as previously mentioned. Thus multiple thermocards can be connected in series in this manner to form a thermopile of desired size.

Therefore, if a thermocard consists of, for example 200 thermocouples, combining two thermo-cards in series results in 400 thermocouples in series. Three thermocards in a series results in 600 thermocouples in series and so on. A selected number of thermocards, for example 500 thermocards of 200 thermocouples each, can be connected in series to create a thermopile of 100,000 thermocouples in series economically and in a relatively small volume.

Figure 8:
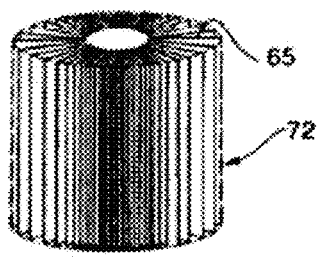
FIG. 8 is a front view of a circular arrangement of thermopile cards on end with each thermocard connected in series.
Figure 10:
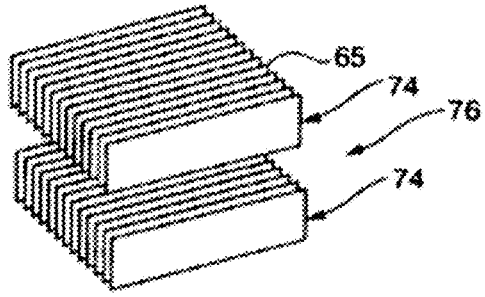
FIG. 10 is an upper front view of two arrangements of the thermopile cards of FIG. 9 and connected in series.
Figure 9:
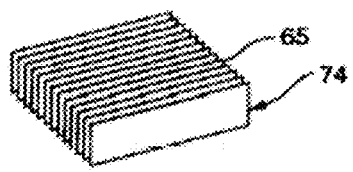
FIG. 9 is an upper front view of a plurality of thermopile cards arranged parallel to one another and connected in series.

A plurality of thermocards 65 may be arranged in a radial pattern 65 as shown in FIG. 8, or in a block form 74 as depicted in FIG. 9 or multiple block form 76 as shown in FIG. 10.

Example calculations are given below of the voltages, the number of thermocouples required and the subsequent number of thermocards required is given below for a temperature gradient of 220° C.:

575 Voltage Required
220 Temperature Delta Celsius
Nichrome 25 Material 1 Seebeck Coefficient
Constantan −35 Material 2 Seebeck Coefficient
43561 Number of thermocouples Required
0.0625 Thermocouple width (in)
25 Length of each Thermopile Card (in)
5445 Total Length of Thermopile 138.3062 M
218 Number of Thermopile Cards Required
1.651376 angle per card in degrees
200 Thermocouples per card
43561 Total number of Thermocouples It will be understood that the materials may also be clad to an electrically insulating substrate and thermocouple lines etched or printed onto the substrate as would occur in common printing of a circuit board.

It will be further understood that the electrically conductive sheets 33 and 60 may also be made by laser cutting, punching or mechanically milling the section and slot arrangements to shape. The shapes may also be made by chemically milling the sheets. The shapes may also be created by laying the thermocouple materials on a substrate similar to printing. Semiconductor and/or other polycrystalline materials such as bismuth and silicon may be used as thermoelectric materials provided by a process of growing crystals or otherwise leaving a coating of the material on a substrate similar to methods used in semiconductor manufacture.

Figure 12:
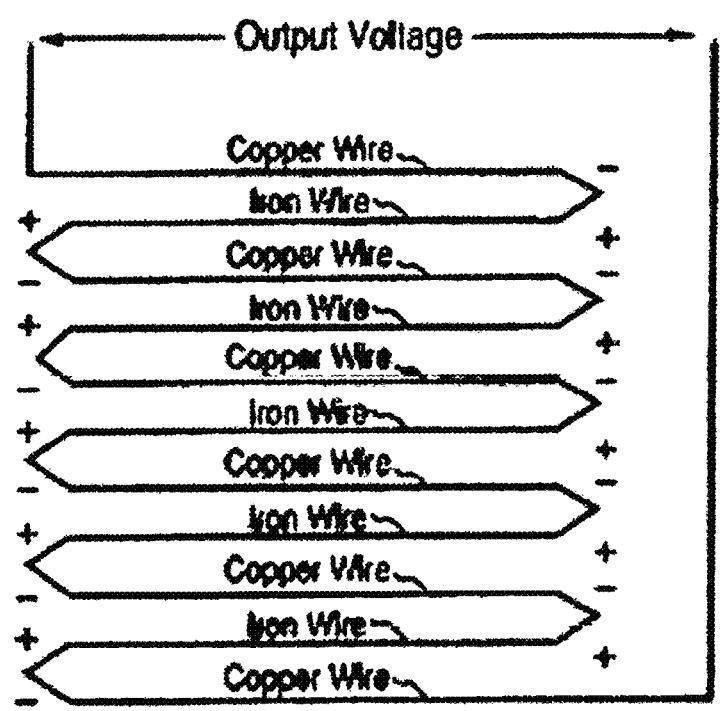
FIG. 12 shows a plurality of thermocouples configured as a simple thermopile.

It will be further understood that the thermocouple as shown in FIG. 12 illustrates an electrical joining of two dissimilar metals such as copper and iron or other dissimilar metals such as Nichrome and constantan, or combinations of others including but not limited to materials such as: silicon; bismuth and bismuth alloys and compounds; iron; copper; aluminum; germanium and germanium alloys; polycrystalline $Bi_2Te_3$—PbTe; antimony; gold; tantalum; lead and lead alloys; alumel; chromel; tungsten; molybdenum, platinum, selenium, tellurium and crystalline tellurium alloys and compounds; Ag—Pb—Sb—Te quaternary systems; Half-Heusler compounds; High-ZT oxides; skutterudite compounds and other materials with Seebeck coefficients sufficient to generate useful voltage and/or current and/or power.

Controls

A control circuit, including switching transistors capable of switching a range of current and voltage is utilized to make use of the voltage created by the thermopile.

Figure 14:
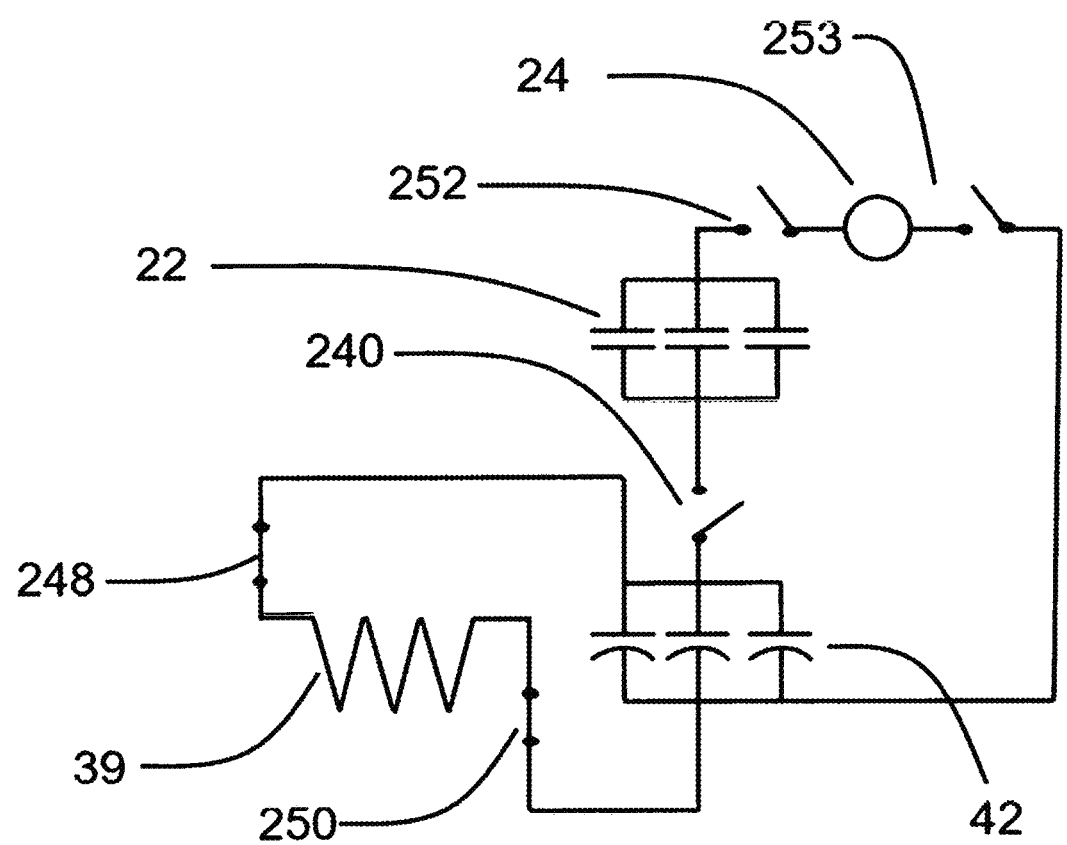
FIG. 14 shows control circuit in state (2), with switches 248 and 250 closed, for the electrical power generation system showing the thermopile charging the capacitance means.
Figure 15:
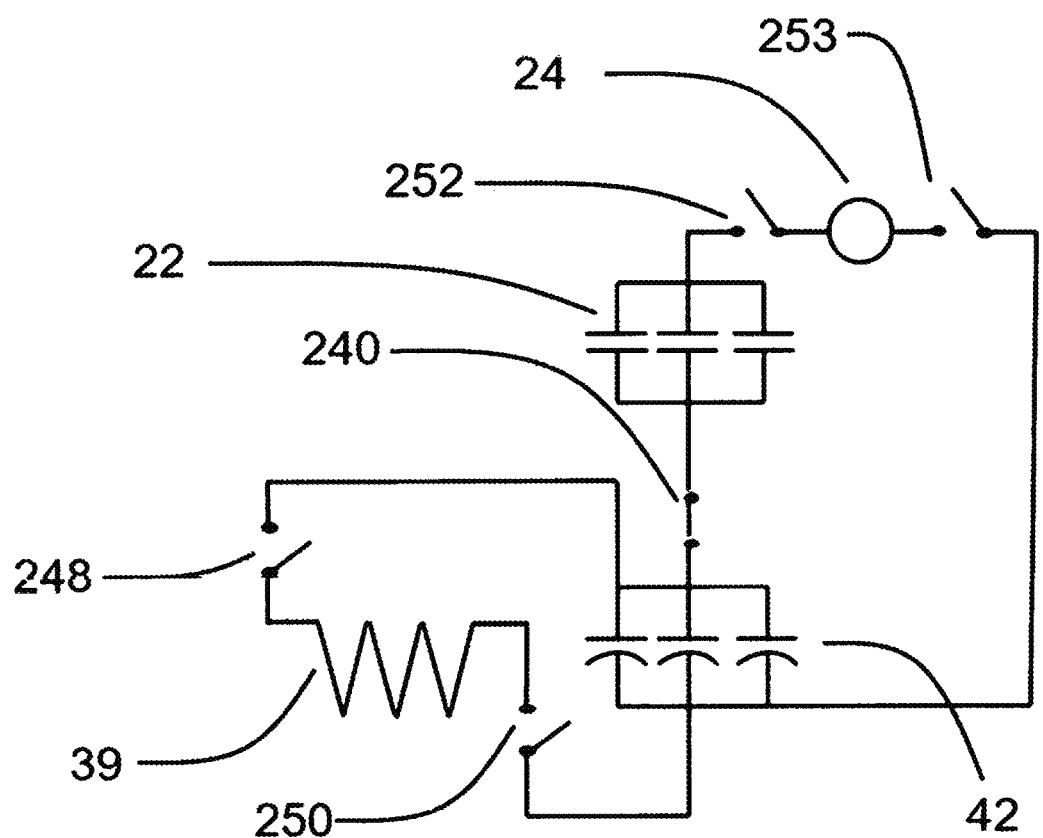
FIG. 15 shows control circuit in state (3), with switch 240 closed and all other switches open, placing the capacitance means first in series with the rechargeable batteries.
Figure 16:
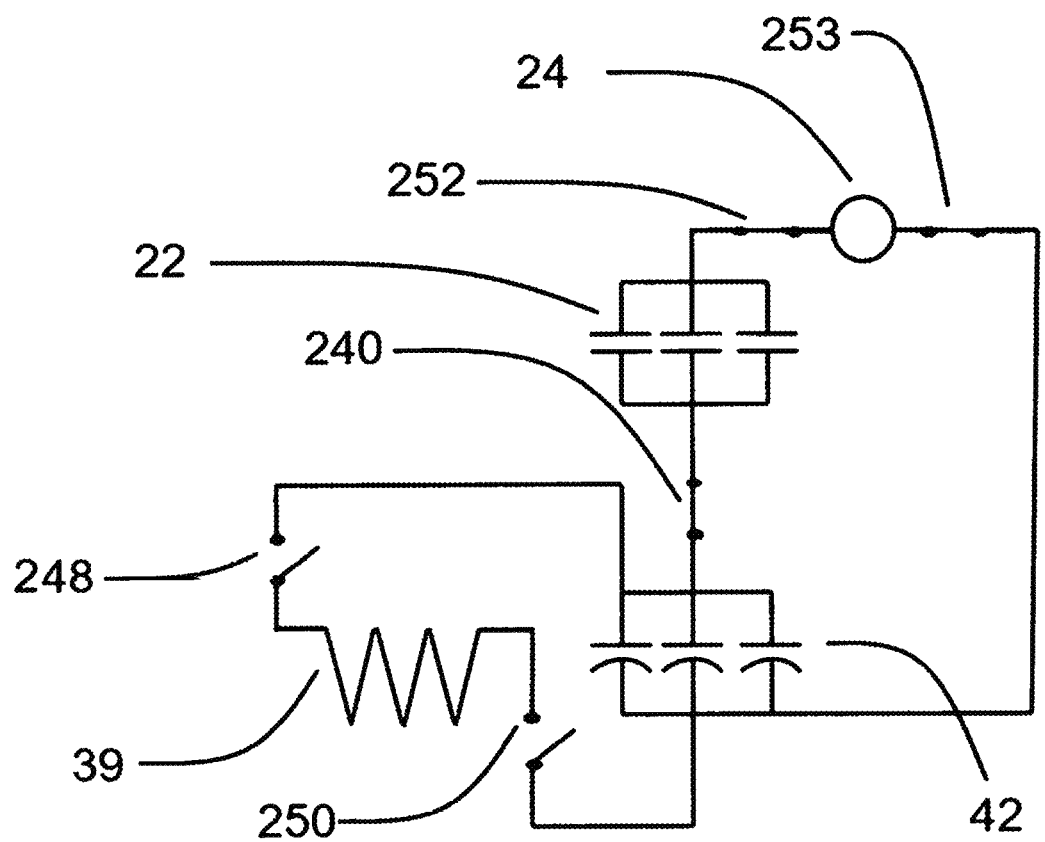
FIG. 16 shows control circuit state (4), with switches 240, 252 and 253 closed and all other switches open, showing the capacitance means and rechargeable batteries connected to power an electric load.

The control circuit operation is shown in FIGS. 13 through 16 and Table 1. Switching transistors 240, 248, 250, 252, and 253 are shown as simple switches in the figures. As shown in Table 1 State (1) and FIG. 13, switching transistors 240, 248, 250, 252, and 253 are initially open. In State (2), the thermopile is connected to the capacitance means through switching transistors 248 and 250 closed with switching transistors 240, 252 and 253 open, as shown in FIG. 14. State (3), the thermopile is disconnected from the capacitance means after the capacitance means is charged to the voltage of the thermopile with switching transistors 240, 248, 250, 252 and 253 open, as shown in FIG. 13. State (4), the circuit connects the capacitance means first in series to rechargeable batteries through selected switching transistor 240 closed and switching transistors 248, 250, 252 and 253 open, as shown in FIG. 15. State (5), the circuit connects the capacitor/battery combination in series through switching transistors with an electrical device/load and closes the circuit to complete the capacitor, battery, load series loop, by switching transistors 240, 252 and 253 closed and 248 and 250 open, as shown in FIG. 16. The capacitance means 42 is thus discharged through the rechargeable batteries 22 and supplied to the load 24. The circuit then returns to its initial state (1), as shown in FIG. 13.

A diagram of the control circuit and its operating steps are shown in FIGS. 13-16 and Table 1. The cycling of the switches is described in the Circuit Cycle table as follows:

TABLE 1

Circuit Cycle

| Cycle State | Switch 240 | Switch 252 | Switch 248 | Switch 250 | Switch 253 | Action |
|---|---|---|---|---|---|---|
| State 1 | Open | Open | Open | Open | Open | All switches open - no current flow |
| State 2 | Open | Open | Closed | Closed | Open | Thermopile charges capacitors |
| State 3 | Open | Open | Open | Open | Open | All switches open - no current flow |
| State 4 | Closed | Closed | Open | Open | Open | Capacitors put in series with batteries |
| State 5 | Closed | Closed | Open | Open | Closed | Capacitors discharge through the batteries and through the load |

Figure 20:
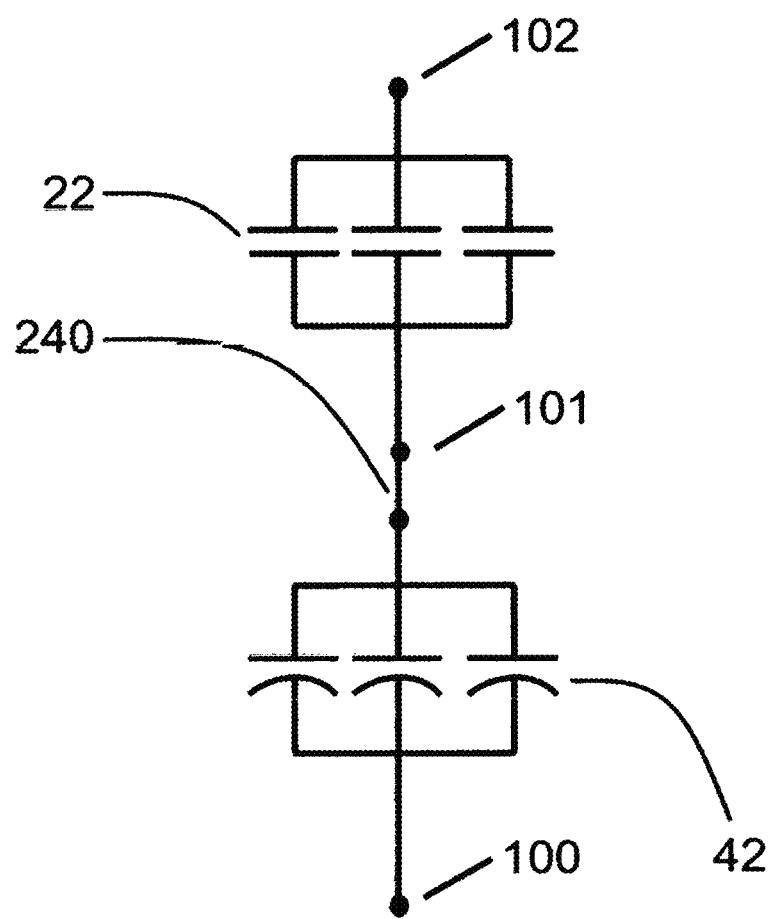
FIG. 20 shows the equivalent circuit of the control circuit of FIG. 14 in state (2) of the control cycle, with switch 248 closed, showing the capacitance means 42 in series with the batteries 22 in an open circuit.

Further explanation of the controls and operation is given as the following:

Charging the capacitance means to the voltage of the thermopile and then placing it series with the batteries in an open circuit, State (2), State (3) and State (4), results in the equivalent circuit shown in FIG. 20. The voltage between points 100 and 101 of FIG. 20 is equivalent to the voltage of the capacitors charged to the thermopile voltage. The voltage between points 101 and 102 of FIG. 20 is the voltage of the rechargeable batteries. The sum of the voltages of the capacitance means and the batteries is the voltage between points 100 and 102 of FIG. 20:

$$Vtotal = Vcapacitors + Vbatteries$$

Figure 21:
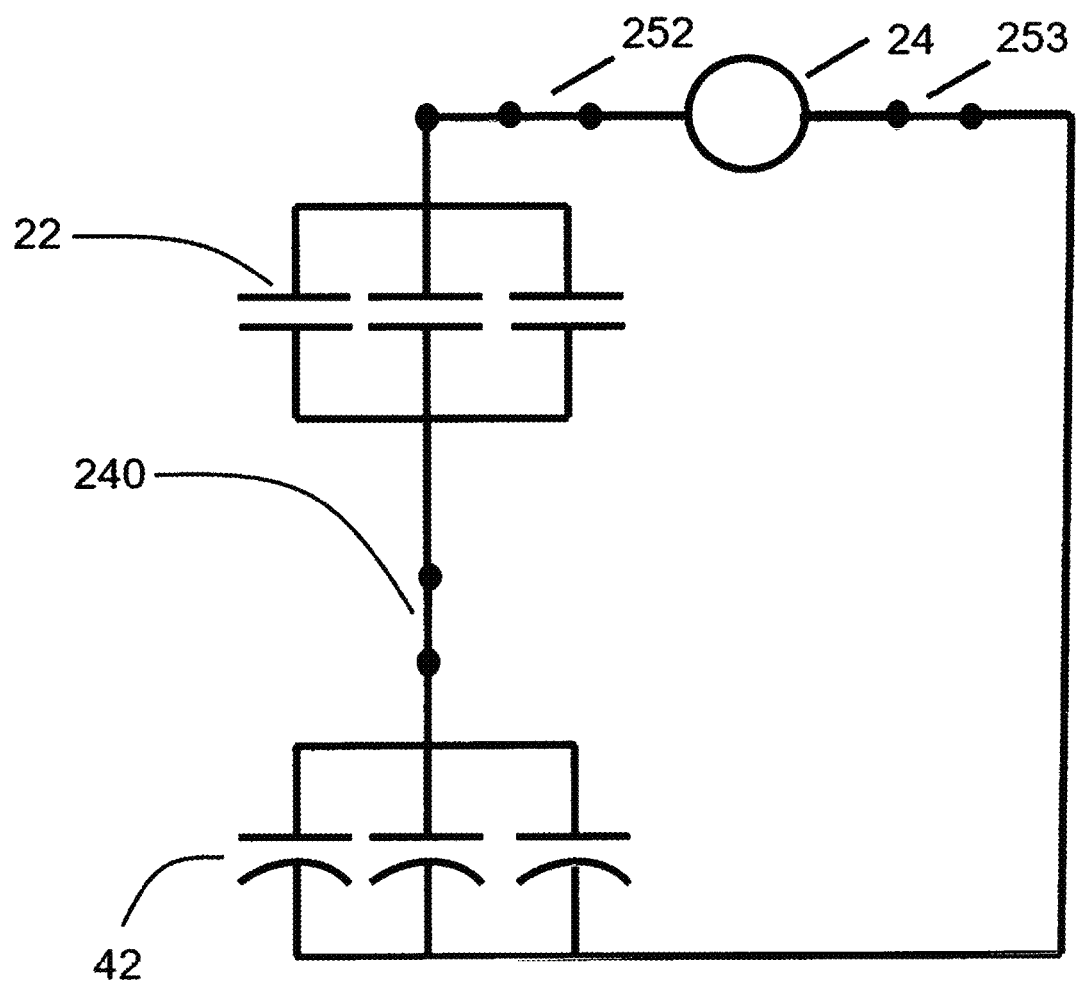
FIG. 21 shows the equivalent circuit of the control circuit of FIG. 16 in state (4) of the control cycle, with switches 240, 252 and 253 closed and supplying power to the electronic device 24.

As shown in FIG. 16, the switches 240, 252 and 253 are closed resulting the equivalent circuit shown in FIG. 21. The capacitance means 42 are then discharged through the batteries 22 and to an electronic load 24 at Vtotal. The current supplied to the electronic load 24 is the max drain rate of the batteries. The switching states 1 through 5 can be repeated at a selected rate.

The control circuit, FIG. 13, will consist of a printed circuit board with power transistors and timing circuit of standard design and manufacturing methods. The timing circuit of known art and not shown, will activate the switching transistors in a specific order and frequency.

Capacitors used may be, for example, approximately five 1000 μF 900 V, such as Cornell Dubilier Electronics (CDE) part number 947D102K901CJRSN. The switches may consist of selected MOSFETs, for example, STMicroelectronics model STY139N65M5 operated via a microcontroller such as Microchip Technology model number PIC24FJ128GA006T-I/PT.

In one example, if the total Seebeck coefficient of a nichrome-constantan thermocouple is $50 \times 10^{-6}$ V/° C., and the effective temperature difference is 100° C., and the number of thermocouples is 100,000; the voltage generated will be $(50 \times 10^{-6} \times 100 \times 100,000) = 500$V. The voltage is dependent upon the size of the thermopile, the extent of temperature difference, and the materials used in construction of the thermopile. As shown in FIGS. 13 through 16 and described in Table 1, control circuitry 20, as described previously, charges capacitors 42 using the voltage from the thermopile 39. The voltage of the capacitors 42 is added to the voltage supplied by the rechargeable batteries 22. For example, if the thermopile charges the capacitors to 500 volts and the capacitors are placed in series with a 12 volt battery in an open circuit, the voltage across the capacitor and battery series will be: 500 Volts+12 Volts=512 volts. The batteries are necessary because the thermopile produces a relatively small amount of current, in the range of milliamps, and cannot power a significant load alone. Whereas the batteries can supply significantly more current than the thermopile, such as drain rates of 10 A or more. Therefore, the voltage of the thermopile in conjunction with capacitors and the drain rate of the batteries combine to provide more power than batteries alone or a thermopile alone. The control circuitry may alternate the polarity of the terminals outputting this voltage to simulate an AC voltage to power AC loads such as AC motors or other AC electronic devices 24.

Temperature Gradient Creation

The creation of the voltage by the thermopile is dependent upon creating a temperature gradient across it and the number of thermocouples used. For example, a source of heat, such as from thermal contact with heated material, waste heat from hot exhaust material, an exothermic chemical reaction, radioactive substance decay, solar heat, or some other means is applied to one set of junctions of the thermopile such at points 71 of FIG. 6. The other set of junctions are exposed to a different temperature by some means such as a cooling fluid, ambient air, ground water, seawater, open space or other means. The thermopile generates DC voltage to power an electronic device depending on the number of thermocouples used and the extent of the temperature difference.

Figure 11:
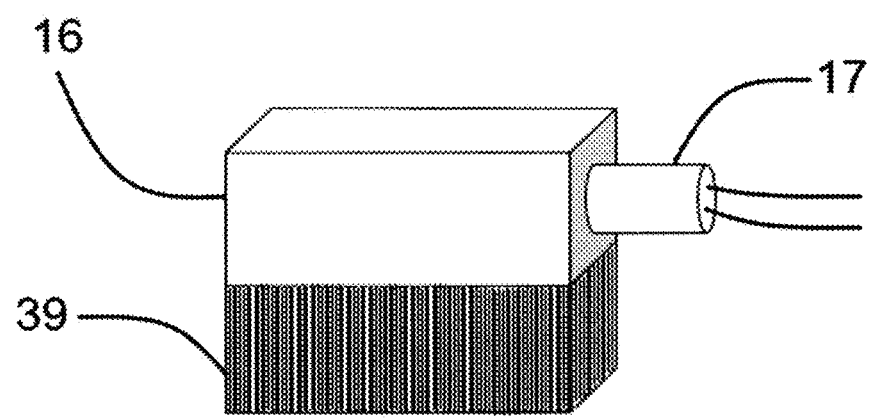
FIG. 11 is a diagram of a hot material, such as liquid paraffin, containment system 16 with heating element 17.

The present invention includes a method for applying heat or coolant to the thermopile as show in FIG. 11. A containment vessel 16, containing either hot or cold material, is placed in thermal contact with one side of junctions of the thermopile 39. The opposite junctions on the other side of the thermopile are exposed to a different temperature, such as ambient air.

For example, as shown in FIG. 11, a hot material such as paraffin may be placed in the containment vessel 16 at 270 degrees Celsius. The containment vessel 16, being in thermal contact with one side of the thermopile 39, increases the temperature of these junctions as previously described. The other, opposite junctions of the thermopile may be left in contact with ambient air at ambient temperature. Thus, a temperature difference is created in the thermopile and a voltage is created. This voltage is then used in the control cycle as described previously.

As shown in FIG. 11, the present invention includes a method for heating the material contained in the containment vessel 16 for use in creating a temperature gradient on the thermopile. The device may utilize a heating element 17 to heat material to a select temperature in the containment vessel. Said heating element may be connected to the electric utility grid on a temporary basis to heat the material in the containment vessel, such as paraffin, to the select temperature, such as 270 degrees Celsius. When the material is at the selected temperature the device is disconnected from the electric utility grid. When power is desired from the device, the heated material, in thermal contact through the containment vessel 16 with one side of the thermopile 39, creates a temperature difference between both sides of said thermopile 39, generating the selected voltage. The control circuit operation begins as described previously and the device can supply power until the material temperature returns to a temperature below which useful voltage is not produced by the thermopile. The device may then be reconnected to the electric utility grid or some other power source external to the device to reheat the material. This is further described later as a part of a Device Recharging System.

It is anticipated that hot or cold material, for use of creating a temperature difference across the thermopile, may be supplied commercially and/or externally to create the temperature gradient instead of being generated as a part of the Device Recharging System. If supplied external to the system, the hot or cold material can be directly added to the containment vessel similar to adding gasoline to an automobile. In this example, the material may be liquid nitrogen, dry ice, hot oil, hot paraffin, or materials that would create a temperature difference on the thermopile as described above.

It is also anticipated that the temperature difference across the thermopile may be created with use of waste heat from an existing process in a form such as hot exhaust, waste steam, or other by-product as the high temperature source and a fluid such as ambient air, seawater, ground water, coolant, or other material as the low temperature source.

Device Recharging System

The present invention can include the temporary use of externally sourced electricity, such as provided by the electric utility grid to recharge the system. The externally sourced electricity is used to heat material in the containment vessel, for example paraffin, to a selected temperature above ambient, for example 270 degrees Celsius, and simultaneously recharge batteries when the device is not in use to power an electric load. In one example shown in FIG. 17, the device is connected to the externally sourced electricity 28, such as from the electric utility grid, to recharge the batteries 22 through a battery charger 26 and simultaneously power a heating element 17. For example, the heating element may heat paraffin as the material contained in the thermally insulated containment vessel 16, to 270 degrees Celsius. When the batteries are fully recharged and the material is heated to a selected temperature, the device will be disconnected from the external electric source. The material stored in the containment vessel 16 at the selected temperature and the recharged batteries 22 store energy for the device for portable use later when needed. When the batteries are drained and the material has cooled to the extent that power from the device is not useful to power the desired load, the device must be reconnected to the external power source, such as the electric utility grid, to recharge the batteries and reheat the material to the desired temperature. The device is then considered fully charged again. Thus, the device is not a perpetual motion device, but rather a rechargeable device. FIG. 17 show this example of the system. FIG. 17 shows the containment vessel 16, the heating element 17, the thermopile 39, the control circuit 20, the capacitors of the control circuit 42, the rechargeable batteries of the control circuit 22, the battery recharger 26, an electronic load 24, and an external electricity source that is temporarily connected to the device to recharge the system 28.

Benefits of the System

A benefit of the system is to lessen the amperage supplied by the batteries for a given voltage electronic device requiring a given wattage. By using the high voltage of the thermopile, a high voltage load can be operated without requiring batteries alone to provide both voltage and current. Power=Voltage×Current, using the higher voltage requires less amperage for a given power output. For example, a 60 hp, 200V electric load requires roughly 224 amps. A 60 hp, 500V load requires roughly 90 amps. Thus, less amperage is required for the given power output of 60 hp because the device charges the capacitance means at the voltage of the thermopile. Less current from the batteries are required and battery life is greatly extended. Extending battery life would, therefore, extend the usable range of electric devices between recharging periods. This invention would also be beneficial in low power DC devices.

Another benefit is that waste heat from existing processes can be captured and turned into useful electricity. The system is also inherently suitable for marine applications where water is cold and vessels, such as submarines and ships, create waste heat in the form of exhaust and/or steam.

Another benefit includes the fact that electric devices and solid state systems are inherently more reliable and longer lasting than conventional internal combustion generators. There are less moving parts, less control and monitoring systems and emissions controls to fail in a purely electric system. The system is inherently suited to space systems and general aerospace systems since no oxygen combustion is required and the weight of fuel and combustion systems is avoided.

OBJECT OF THE SYSTEM

It is an object of this invention to use a hot or cold material, at a selected temperature and a second material at a different selected temperature, such as ambient air, to provide a temperature gradient which enables a thermopile to supply high DC voltage and to use the DC voltage in combination with capacitors charged by onboard batteries and control circuitry to power an electric device.

It is also an object of this invention to provide a thermoelectric power generator capable of generating DC voltage or single phase or three-phase AC voltage.

It is also an object of the present invention to create useful quantities of electric power by generating thermo electricity to assist and extend the life of batteries. Since power is voltage times current, by using the thermopile to create a voltage, the batteries can therefore provide lower current for a given power output, see page 20.

It is also an object of this invention to provide a thermoelectric power generator which includes rechargeable batteries which are recharged by input power by temporarily connecting the device to an external electric power source such as the electric utility grid.

It is also an object of this invention to include means to heat material for creating a temperature difference between the junctions of the thermopile, by temporarily connecting the device to an external electric source, such as the electric utility grid, such that voltage is created in the thermopile.

I claim:

1. A thermopile for generating electric current wherein the thermopile constructed of two selected materials, the sheet of the first thermoelectric material with a first Seebeck Coefficient property and the sheet of the second thermoelectric material with a second Seebeck Coefficient property wherein both sheet have the same length and width and where the length is greater than the width;

wherein slots of a determined length and width are created in the first thermoelectric material sheet such that the length of the slots are parallel to the width of the sheet and successive slots are created parallel to each other and at a determined distance from one another along the entire length of the sheet and the area between the slots forms lines of the first thermoelectric material and the areas of the sheet above and below the slots form tabs;

wherein slots are similarly created in the second thermoelectric material sheet but at an angle in relation to the slots of the first thermoelectric material such that when the sheet of the second thermoelectric material is compared to the sheet of the first thermoelectric material, the bottom of the first slot of the second thermoelectric material aligns with the bottom of the first slot of the first thermoelectric material sheet and the top of the first slot of the second thermoelectric material aligns with the with top of the second slot of the first thermoelectric material sheet and all successive slots in both sheets align in the same way and the area between the slots forms lines of the second thermoelectric material and the areas of the sheet above and below the slots form tabs;

wherein an electrically insulating material with the same length or greater than the length of the sheet of the first thermoelectric material but with less width than the slots created in the sheets of each thermoelectric material is placed on top of the sheet of the first thermoelectric material such that the electrically insulating material covers only a portion of the slots in the sheet of the first thermoelectric material and leaves the tops and bottoms of said slots exposed; wherein the sheet of the second thermoelectric material is subsequently placed on top of the electrically insulating material such that the slots of the sheet of the second thermoelectric material align with the slots of the sheet of the first thermoelectric material in said manner and contact each other where the slots in each align at top and bottom and at the tabs of each slot;

wherein areas where the two sheets of thermoelectric materials overlap, and are not physically separated by the electrically insulating material, are fastened together in an electrically conductive manner at these areas of overlap only; wherein after the two sheets of thermoelectric material are fastened together in an electrically conductive manner where the lines of thermoelectric material contact each and are not physically separated by the electrically insulating material, the tabs of both sheets of thermoelectric material are removed forming a zig-zag pattern of lines of the first thermoelectric material and the second thermoelectric material and thus creating a series of thermocouples commonly known as a thermopile;

wherein the first line of the first thermoelectric material will be free and unconnected at the top and the last line of the second thermoelectric material will be free and unconnected at the top forming two free ends of the thermopile.

2. The invention of claim 1 wherein said first thermocouple material free end of one thermopile is connected to the second thermocouple material free end of a second thermopile and are connected in series forming a larger thermopile; whereby multiple thermopiles may be connected in similar manner to form a thermopile of selected size.

3. The invention of claim 1 wherein the slots of first sheet of first Seebeck coefficient is formed by punching, cutting, etching, printing or chemical milling creating vertical, parallel slots in said first sheet of said material; a second material of said second Seebeck coefficient is formed by punching, cutting, etching, printing or chemical milling creating parallel slots at an angle such that the top of a given slot in said first material aligns with the top of a first slot in said second material and the bottom of the slot in said first material aligns with the bottom of the adjacent slot in said second material.

4. The invention of claim 2 whereby the top of the thermopile is exposed to a heat source at first temperature and the bottom of the thermopile is exposed to a second temperature selectively different than said first temperature.

5. The invention of claim 4 including a control circuit to whereby common solid state transistors are used as electrical switches to connect the thermopile to common electrical capacitors and common batteries comprising the following steps at selected frequency whereby:

a. connecting the thermopile to said capacitors whereby charging said capacitors up to the voltage of the thermopile;

b. opening a connection from said thermopile to said capacitors;

c. connecting said capacitors to be in series with and discharge into said batteries;

d. connecting said capacitors and batteries to an electronic load, such as an electric motor, and discharging energy stored in said capacitors and batteries through said electronic load;

whereby steps a-d above are repeated at a selected frequency.

6. The invention of claim 5 including alternating the positive and negative polarity of the connection to the electronic load at a select frequency to simulate an alternating current.

7. The heat source of invention of claim 4 is achieved by selectively heating a material such as a paraffin by connecting the system to an external electric source, such as the electric utility grid, and electrically heating the material for purposes of creating a temperature difference on said thermopile while simultaneously recharging said rechargeable batteries.

\* \* \* \* \*